(12) United States Patent
Sudo et al.

(10) Patent No.: US 11,990,188 B2
(45) Date of Patent: May 21, 2024

(54) SEMICONDUCTOR APPARATUS AND CONTINUOUS READOUT METHOD

(71) Applicant: Winbond Electronics Corp., Taichung (TW)

(72) Inventors: Naoaki Sudo, Kanagawa (JP); Makoto Senoo, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 302 days.

(21) Appl. No.: 17/512,687

(22) Filed: Oct. 28, 2021

(65) Prior Publication Data

US 2022/0246217 A1 Aug. 4, 2022

(30) Foreign Application Priority Data

Feb. 3, 2021 (JP) ................................ 2021-015609

(51) Int. Cl.
*G11C 16/04* (2006.01)
*G06F 11/10* (2006.01)
*G11C 16/26* (2006.01)

(52) U.S. Cl.
CPC .......... *G11C 16/26* (2013.01); *G06F 11/1068* (2013.01); *G11C 16/0483* (2013.01)

(58) Field of Classification Search
CPC ........................... G11C 16/26; G11C 16/0483
See application file for complete search history.

(56) References Cited

U.S. PATENT DOCUMENTS

| 7,751,249 | B2 | 7/2010 | Lee et al. | |
| 11,120,877 | B2* | 9/2021 | Okabe | G11C 16/10 |
| 11,430,495 | B2* | 8/2022 | Kasai | G11C 7/1066 |
| 11,487,343 | B2* | 11/2022 | Sudo | G06F 1/3275 |
| 2013/0145093 | A1 | 6/2013 | Kaminaga et al. | |
| 2014/0104947 | A1 | 4/2014 | Yamauchi et al. | |
| 2020/0372958 | A1 | 11/2020 | Kasai | |

FOREIGN PATENT DOCUMENTS

| CN | 101779246 | 3/2013 |
| JP | 5323170 | 10/2013 |
| JP | 5667143 | 2/2015 |

(Continued)

OTHER PUBLICATIONS

"Office Action of Taiwan Counterpart Application", issued on Jun. 21, 2022, p. 1-p. 8.

(Continued)

*Primary Examiner* — Pho M Luu
(74) *Attorney, Agent, or Firm* — JCIPRNET

(57) ABSTRACT

A semiconductor apparatus and a continuous readout method for improving prior continuous readout are provided. A flash memory includes: a NAND memory cell array, an input/output circuit, an ECC circuit, a controller, a word-line selection circuit, a page buffer/readout circuit, and a row selection circuit. When performing the continuous readout of pages, the controller performs an array readout of a first half page of a selection page on the memory cell array and an array readout of a second half page of the selection page on the memory cell array independently, and continuously outputs the respectively read data of the half pages in synchronization with a clock signal.

15 Claims, 7 Drawing Sheets

(56) References Cited

FOREIGN PATENT DOCUMENTS

| | | |
|---|---|---|
| JP | 6744950 | 8/2020 |
| KR | 101293223 | 8/2013 |
| KR | 20140046979 | 4/2014 |
| TW | I527058 | 3/2016 |
| TW | 202105393 | 2/2021 |

OTHER PUBLICATIONS

"Office Action of Korea Counterpart Application", with English translation thereof, issued on Jul. 26, 2023, pp. 1-9.

* cited by examiner

| Address | Value | Definition |
|---------|-------|------------|
| XXh | 1 | • Frequency Fr: 80 MHz < Fr < 120 MHz under DDR<br>• The clock is forbidden from stopping during the continuous readout |
| | 0 | • Frequency Fr: 80 MHz or less under DDR<br>• Frequency Fr: 166 MHz or less under SDR<br>  (all ranges) |

SEMICONDUCTOR APPARATUS AND CONTINUOUS READOUT METHOD

CROSS-REFERENCE TO RELATED APPLICATION

This application claims the priority benefit of Japan application serial no. 2021-015609, filed on Feb. 3, 2021. The entirety of the above-mentioned patent application is hereby incorporated by reference herein and made a part of this specification.

BACKGROUND

Technical Field

The present disclosure relates to a semiconductor apparatus, particularly relates to a continuous readout method of a NAND flash memory.

Description of Related Art

A NAND flash memory is sometimes equipped with a continuous readout function (or a burst read function) that reads multiple pages continuously in response to external commands. A page buffer/readout circuit includes, for example, two latches. When performing continuous readout, while one of the latches holds the data read from the array, the data held by the other latch can also be output (as in Patent Document 1, Patent Document 2, Patent Document 3, etc.). Patent Document 4 discloses a readout method that realizes a continuous readout method with further increased speed.

RELATED ART

Patent Document

[Patent Document 1] Japanese Laid-Open No. 5323170
[Patent Document 2] Japanese Laid-Open No. 5667143
[Patent Document 3] US Application US2014/0104947A1
[Patent Document 4] Japanese Laid-Open No. 6744950

SUMMARY

FIG. 1 shows a schematic structure of a NAND flash memory with the on-chip error checking and correction (ECC) function. The flash memory includes: a memory cell array 10 including a NAND string, a page buffer/readout circuit 20, a data transfer circuit 30, a data transfer circuit 32, an error checking and correction circuit (hereinafter referred to as ECC circuit) 40, and an input/output circuit 50. The page buffer/readout circuit 20 includes two latches L1 and L2 (a latch is, for example, a 4 KB latch) that hold the read data or the input data to be programmed. The latch L1 and the latch L2 respectively include a first cache C0 and a second cache C1 (a cache is, for example, a 2 KB cache).

FIG. 2 shows a timing chart disclosed in Patent Document 4 when multiple pages are read continuously. First, an array readout of page P0 is performed, and data of page P0 are held in the first cache C0 and the second cache C1 (POC0, POC1) of the latch L1. Then, the data of the first cache C0 and the second cache C1 of the latch L1 are transferred to the first cache C0 and the second cache C1 of the latch L2, and the data in the first cache C0 and the second cache C1 are subjected to ECC decoding in the ECC circuit 40. When an error is detected, the data in the first cache C0 and the second cache C1 of the latch L2 are corrected.

In the continuous readout, the row address counter is incremented automatically to read a next page P1, and the read data is transferred to the first cache C0 and the second cache C1 of the latch L1. During this period, the data of the first cache C0 of the latch L2 is transferred to the input/output circuit 50, and the data held by the input/output circuit 50 is output in synchronization with an external clock signal ExCLK provided externally. Then, the data of the second cache C1 of the latch L2 are output from the input/output circuit 50 in synchronization with the external clock signal ExCLK; and during this period, the data of the first cache C0 of the latch L1 is transferred to the latch L2, and the ECC circuit 40 performs the ECC processing.

When the data in the second cache C1 of the latch L1 is transferred to the latch L2 and the data in the first cache C0 of the latch L2 is output from the input/output circuit 50, the data in the second cache C1 of the latch L2 is processed by ECC; then, while the data in the second cache C1 of the latch L2 is output from the input/output circuit 50, a next page P2 is read from the array and transferred to the first cache C0 and the second cache C1 of the latch L1, and the data of the first cache C0 is transferred to the latch L2 for ECC processing.

The continuous readout using the latch L1 and the latch L2 essentially starts from the array readout of the page P2. The timing for starting the array readout of page P2 is not the time point when the data of page P1 is finished being transferred from the latch L1 to the latch L2. Instead, it is an earlier time point when the data of page P1 of the first cache C0 of the latch L1 is transferred to the latch L2. Even if the timing of the array readout of page P2 is made earlier, the array reading still takes a certain amount of time in practice; therefore, at the time point when the data of page P2 read from the array is transferred to the latch L1, if the external clock signal ExCLK with a high frequency is adapted to increase the speed of continuous readout, the transfer of the data of the page P1 from the latch L1 to the latch L2 has been completed.

The array readout time tARRAY is defined by the starting timing for the array readout and the finishing timing for the array readout. The finishing timing of the array readout of the page P2 is the starting timing of the array readout of a next page P3. When the pages of page P2, page P3, page P4, and so on are read continuously, the array readout time tARRAY is continuous in a similar way.

Here, the array readout operates based on an internal clock signal according to the determined timings, whereas the data output operates based on the external clock signal ExCLK that is asynchronous with the internal clock signal. The condition of the continuous readout shown in FIG. 2 is expressed by Equation (1) as follows. The array readout time tARRAY and a time tECC are fixed times, and a time tDOUT is specified by the frequency of the external clock signal ExCLK.

$$tARRAY < tDOUT(1 \text{ page})$$

$$tECC < tDOUT(\text{half page}) \quad \text{Equation (1)}$$

As long as these conditions are met, i.e., that the time tDOUT for outputting one page of data is greater than the array readout time tARRAY and the time tDOUT for outputting half page data is greater than the time tECC for ECC processing, then the high-speed continuous readout shown in FIG. 2 may be realized. The following situation is shown in FIG. 2: compared with the array readout time tARRAY of the page P2, the total output time tDOUT of the second cache data time of the output page P0 and the first cache data time of the output page P1 is longer, and the array readout time tARRAY of the page P2 starts from the time when the data of page P in the first cache C0 1 is start being transferred from the latch L1 to the latch L2 and ends at the time when the data of the next page P2 in the first cache C0 is start being transferred from the latch L1 to the latch L2. Compared with the time tECC for subjecting the data of the first cache C0 of the latch L2 to the ECC processing, the time tDOUT for outputting the data of the second cache C1 of the latch L2 is longer.

However, by changing the starting timing of array readout, another timing condition is generated. Assume that a user uses an external clock signal ExCLK that has a slow frequency, at the time point when the data read from the array is transferred to the latch L1, as the latch L1 holds the data of the previous page due to the slow frequency of the external clock signal ExCLK, the data of the previous page of the latch L1 is destroyed by the data of the next page read from the array.

Equation (2) expresses the condition for not producing such data destruction:

$$t\text{DOUT(half page)} < t\text{ARRAY} \qquad \text{Equation (2)},$$

and Equation (3) is exported from Equation (1) and Equation (2):

$$t\text{ARRAY} < t\text{DOUT} < t\text{ARRAY} \times 2 \qquad \text{Equation (3)}.$$

To be able to use the external clock signal ExCLK with a frequency lower than the minimum frequency specified in Equation (3), the existing flash memory prepares a status register, and performs the high-speed continuous readout as shown in FIG. 2 based on the value set in the status register, or performs a switching between the continuous readout and the array readout after the data held in the latch L1 is transferred to the latch L2. FIG. 3 shows an example of the status register. The set value "1" corresponds to the use of the high-speed frequency external clock signal ExCLK, and the array readout starts at the timing shown in FIG. 2 in the continuous readout. The set value "0" corresponds to the use of the low-speed frequency external clock signal ExCLK, and the array readout starts at the timing of continuous readout. The set value of the status register may be rewritten from outside, and the user may input the rewritten command from the outside and the address "XXh" of the status register to change the set value of the status register.

This type of existing flash memory may realize the high-speed continuous readout by maximizing the frequency of the external clock signal ExCLK, and there is also a condition for the minimum frequency of the external clock signal ExCLK. To be able to use such a low-speed frequency, it is necessary to provide a circuit for switching the starting timing of the status register or array readout, such that it is complicated for the user to set the action of the status register.

In addition, during continuous readout, array readout is performed during data output. When the current of the input/output (TO) noise overlaps the current of the array readout at the timing of a certain action, a large peak current Icc is generated. The input/output circuit 50 includes, for example, a parallel/series conversion circuit connected with "m" number of flip-flops, and converts m-bit parallel data into serial data in synchronization with the external clock signal ExCLK, and outputs it from an external terminal. On the other hand, in the continuous readout, in order to precharge the bit line, as a large current flows, and if the size of a page is larger, the current consumed is correspondingly larger.

The array readout is performed synchronously with the internal clock signal InCLK generated by the internal clock generator, but the internal clock signal InCLK is asynchronous with the external clock signal ExCLK. When the edges of the two clock signals overlap or approach in terms of time, a large peak current Icc is generated due to an action synchronized with the clock signal. The large peak current Icc makes the internal supply voltage drop temporarily or generates noises, which delays the circuit action or renders the action unstabilized. Therefore, the peak current Icc is reduced as much as possible.

A continuous readout method of pages of a NAND flash memory of the present disclosure includes: a first readout step, reading a first data of a half page from a first memory cell array, and holding the readout of the first data in the first holding circuit; a second readout step, reading a second data of a half page from a second memory cell array at a different timing from the first memory cell array, and holding the readout of the second data in a second holding circuit; a first output step, outputting the first data in synchronization with a clock signal; and a second output step, outputting the second data continuously after outputting the first data in synchronization with the clock signal.

The continuous readout method further includes: a first transfer step, transferring the first data held in the first holding circuit to a third holding circuit; and a second transfer step, transferring the second data held in the second holding circuit to a fourth holding circuit, wherein, after the first transfer step, a first data of a half page of a next page read in the first read step is held in the first holding circuit, and after the second transfer step, a second data of a half page of the next page read in the second read step is held in the second holding circuit. The continuous readout method further includes: a first ECC step, performing error checking and correction on the first data held in the third holding circuit; and a second ECC step, performing error checking and correction on the second data held in the fourth holding circuit. While the first data held in the third holding circuit is output in the first output step, the second ECC step performs error checking and correction on the second data of the next page held in the fourth holding circuit. While the second data held in the fourth holding circuit is output in the second output step, the first ECC step performs error checking and correction on the first data of the next page held in the third holding circuit. The first readout step reads the first data of the half pages of the first two pages in response to the first data held in the third holding circuit being output in the first output step. The second readout step reads the second data of the half pages of the first two pages in response to the second data held in the fourth holding circuit being output in the second output step. The first output step and the second output step alternately and continuously output the first data and the second data from each of the external terminals.

The continuous readout method of pages of the NAND flash memory of the present disclosure further includes: a readout step, independently performing an array readout of the first half page and an array readout of the last half page on the memory cell array; a holding step, holding the first data of the half page read from the first array in the first holding circuit, and holding the second data of the half page read from the second array in the second holding circuit; and an output step, performing the readout step and the holding step of the readout of multiple pages, and alternately outputting the first data and the second data in synchronization with the clock signal.

A semiconductor apparatus of the present disclosure includes: a first array readout component, adapted to read data from a NAND first memory cell array; a second array readout component, adapted to read data from a NAND second memory cell array; a first holding component, adapted to hold the data read by the first array readout component; a second holding component, adapted to hold the data read by the second array readout component; an output component, adapted to output the data held by the first holding component and the second holding component in synchronization with the clock signal; and a control component, adapted to control the readout action. Providing that the control component that controls the continuous readout of the pages, the first array readout component reads the first data of the half page, the second array readout component reads the second data of the half page, and the output component alternately and continuously outputs the first data and the second data.

In an embodiment of the present disclosure, the first holding component includes: a first latch, adapted to hold the first data read by the first array readout component; and a second latch, adapted to hold the first data transferred from the first latch. After the first data is transferred from the first latch to the second latch, the first data of the half page of the next page read by the first array readout component is held in the first latch. The second holding component includes: a first latch, adapted to hold the second data read by the second array readout component; and a second latch, adapted to hold the second data transferred from the first latch. After the second data is transferred from the first latch to the second latch, the second data of the half page of the next page read by the second array readout component is held in the first latch.

The semiconductor apparatus further includes an error checking and correction component for detecting data error. The error checking and correction component performs error checking and correction on the first data or the second data held in the second latch of the first holding component and the second holding component. While the output component outputs the first data held in the second latch of the first holding component, the error checking and correction component performs error checking and correction on the second data of the next page held in the second latch of the second holding component. While the output component outputs the second data held in the second latch of the second holding component, the error checking and correction component performs error checking and correction on the first data of the next page held in the second latch of the first holding component. The first array readout component reads the first data of the half page of the first two pages in response to the first data held in the second latch of the first holding component that is output by the output component, and the second array readout component reads the second data of the half page of the first two pages in response to the second data held in the second latch of the second holding component that is output by the output component. The first memory cell array and the second memory cell array may be formed on the same chip. Or, the first memory cell array and the second memory cell array may be formed on different chips. The output component alternately and continuously outputs the first data and the second data from each of the external terminals.

The readout method of the NAND flash memory of the present disclosure includes the following steps: a command is received; based on the command, it is determined whether it is normal readout of page of page or continuous readout of multiple pages; when it is determined to be normal readout of page, the first memory cell array and the second memory cell array are accessed at the same time, and one page of data is read from the first memory cell array and the second memory cell array, and the read data is held in the first holding circuit and the second holding circuit; and when it is determined to be continuous readout of multiple pages, the first memory cell array and the second memory cell array are accessed separately, and the first data of the half page is read from the first memory cell array, and the read first data is held in the first holding circuit, the second data of the rest of the half page is read from the second memory cell array, and the read second data is held in the second holding circuit.

The semiconductor apparatus of the present disclosure further includes: the control component determines whether it is normal readout of page or continuous readout of multiple pages based on the received command. When it is determined as normal readout of page, one page of data is read from the first memory cell array and the second memory cell array at the same time, and the first holding component and the second holding component hold the read data. When it is determined as continuous readout of multiple pages, the first data of the half page is read from the first memory cell array, and the first holding component holds the readout of the first data, and the second data of the rest of the half page is read from the second memory cell array, and the second holding component holds the readout of the second data.

According to the present disclosure, when performing continuous readout of pages, since the readout of the half page from the first memory cell array and the readout of the half page from the second memory cell array are performed independently, the pages may be read continuously without being restricted by the frequency of the clock signal. And so, by dividing the pages into half pages for the readout, the peak current during the array readout may be reduced, thereby improving the reliability of the circuit action.

DESCRIPTION OF THE EMBODIMENTS

Figures 3, 4:
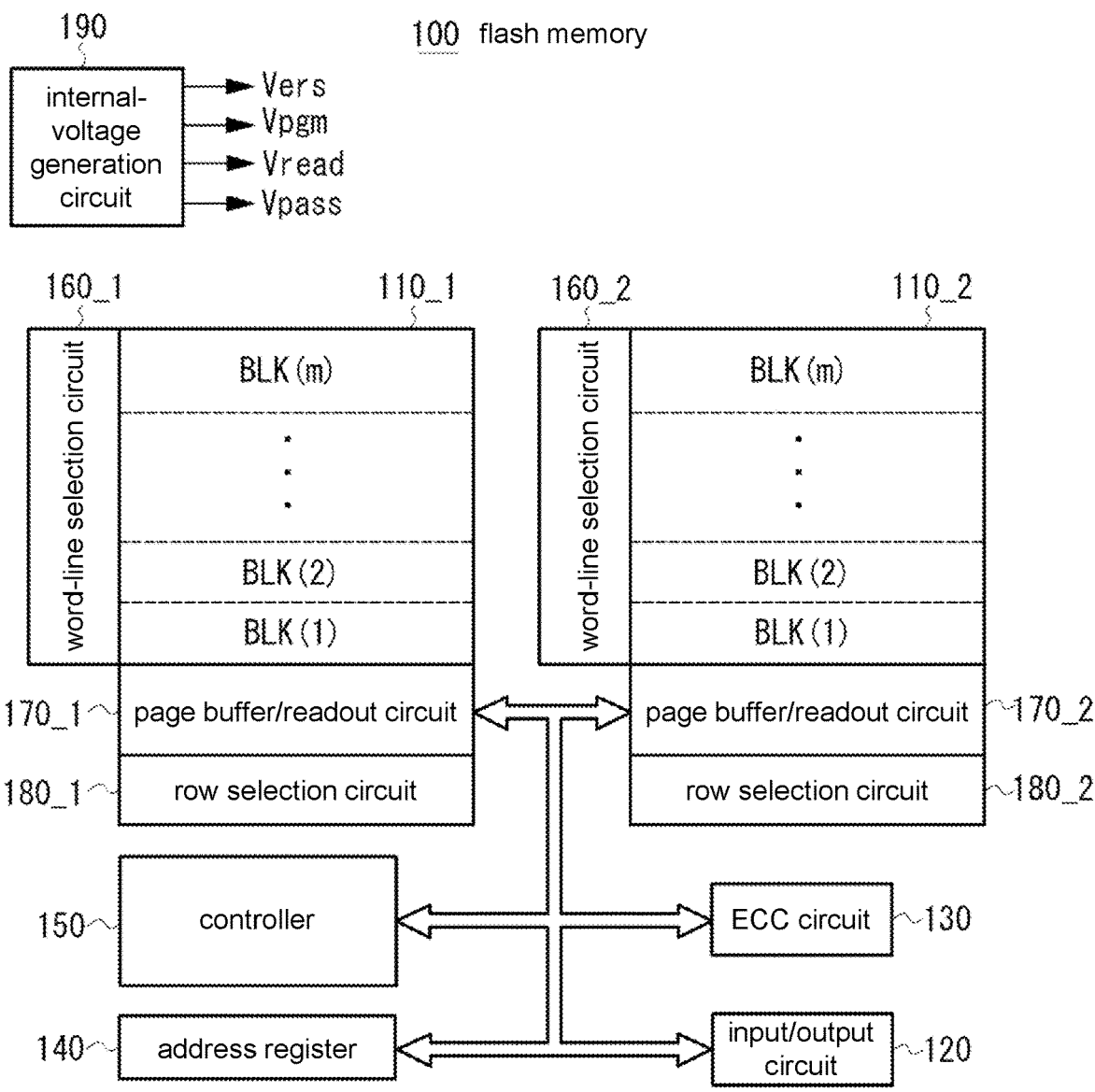
FIG. 3 is a diagram of a conventional state register.
FIG. 4 is a block diagram of a structure of a NAND flash memory according to an embodiment of the present disclosure.

FIG. 4 is a diagram of a structure of a NAND flash memory according to an embodiment of the present disclosure. A flash memory 100 includes: a memory cell array 110_1 and a memory cell array 110_2, comprising a plurality of memory cells arranged in an array; an input/output circuit 120, connected to external input/output terminals, and adapted to output the read data to the outside or import the input data from the outside in response to an external clock signal ExCLK; an ECC circuit 130, adapted to perform error checking and correction on the data to be programmed or the read data; an address register 140, adapted to receive address data through the input/output circuit 120; a controller 150, adapted to control each part based on the command data received through the input/output circuit 120 or the control signal applied to the external terminal; a word-line selection circuit 160_1 and a word-line selection circuit 160_2, adapted to decode column address information Ax from the address register 140, and select blocks or word lines based on a decoding result; a page buffer/readout circuit 170_1 and a page buffer/readout circuit 170_2, adapted to hold the data read from the memory cell array 110_1 and the memory cell array 110_2, or hold the data to be programmed into the array; a row selection circuit 180_1 and a row selection circuit 180_2, adapted to decode row address information Ay from the address register 140, and select a bit line of the page buffer/readout circuit 170_1 and the page buffer/readout circuit 170_2 based on a decoding result; and an internal-voltage generation circuit 190, adapted to generate all kinds of voltages (a programming voltage Vpgm, a pass voltage Vpass, a readout-pass voltage Vread, an erase voltage Vers, etc.) for data readout, programming, eraser, etc.

The flash memory 100 of the present embodiment includes the memory cell arrays 110_1 and 110_2, which are capable of operating independently and respectively, the word-line selection circuits 160_1 and 160_2, the page buffer/readout circuits 170_1 and 170_2, and the row selection circuits 180_1 and 180_2. The controller 150 uses the word-line selection circuit 160_1, the word-line selection circuit 160_2, the page buffer/readout circuit 170_1, the page buffer/readout circuit 170_2, the row selection circuit 180_1, and the row selection circuit 180_2 to control respectively the actions of the memory cell array 110_1 and the memory cell array 110_2, such as reading, programming, and erasing. The memory cell array 110_1, the memory cell array 110_2, the word-line selection circuit 160_1, the word-line selection circuit 160_2, the page buffer/readout circuit 170_1, the page buffer/readout circuit 170_2, and the row selection circuit 180_1, the row selection circuit 180_2 have a common structure. Therefore, only one of the above is described in the following description.

Figure 5:
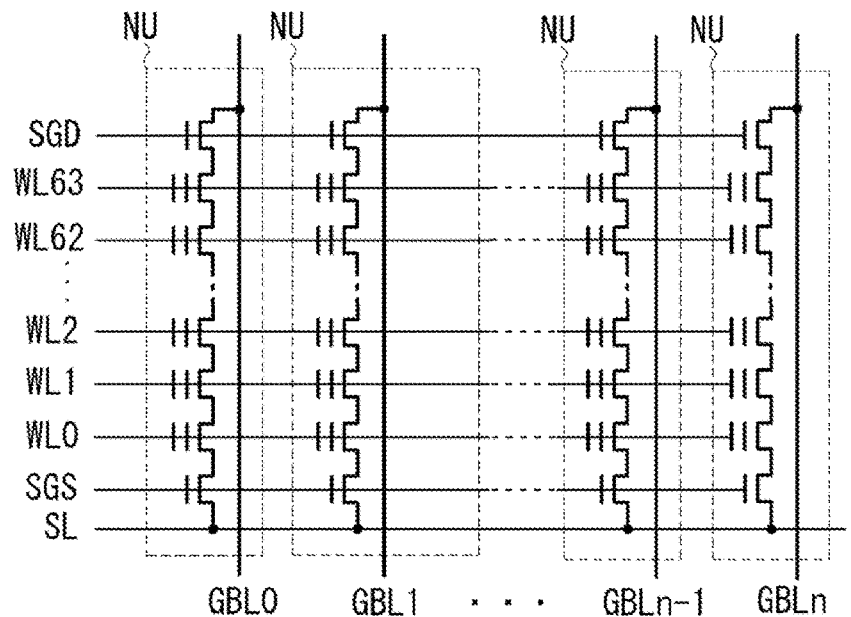
FIG. 5 is a circuit structure diagram of a NAND string according to an embodiment.

The memory cell array 110_1 has, for example, "m" number of memory blocks BLK(0), BLK(1) ..., BLK(m−1) arranged along the row direction. A plurality of NAND strings NU are formed in one storage block, and the NAND string is formed by connecting a plurality of memory cells in series. As shown in FIG. 5, one NAND string NU includes a plurality of memory cells MCi (i=0, 1 . . . , 63) connected in series, a bit-line side selection transistor, and a source-line side selection transistor. The drain of the bit-line side selection transistor is connected to a corresponding global bit line GBL, and the source of the source-line side selection transistor is connected to a common source line SL. The control gate of the memory cell MCi is connected to a word line WLi, and the gates of the bit-line side selection transistor and the source-line side selection transistor are respectively connected to a select gate line SGD and a select gate line SGS. Based on the column address information Ax, the word-line selection circuit 160_1 selects a block or word through the select gate line SGD and the select gate line SGS that drive the bit-line side selection transistor and the source-line side selection transistor.

The NAND string NU may be formed two-dimensionally on the surface of the substrate or three-dimensionally on the surface of the substrate. In addition, the NAND string NU may further include dummy cells between the bit-line side selection transistor and the memory cell and/or between the source-line side selection transistor and the memory cell.

Figure 6:
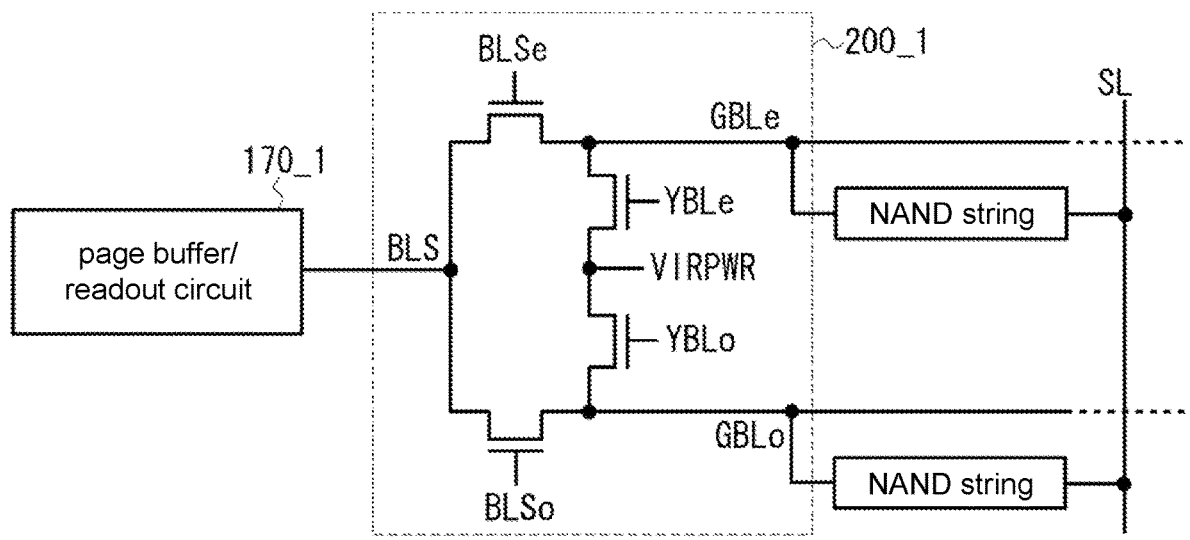
FIG. 6 is a diagram of a structure of a bit-line selection circuit according to an embodiment.

The structure of the bit-line selection circuit is shown in FIG. 6. FIG. 6 shows one page buffer/readout circuit 170_1 shared by an even-bit line GBLe and an odd-bit line GBLo, and a bit-line selection circuit 200_1 connected thereto.

The bit-line selection circuit 200_1 includes: a transistor BLSe, adapted to select the even-bit line GBLe; a transistor BLSo, adapted to select the odd-bit line GBLo; a transistor YBLe, adapted to connect a virtual power supply VIRPWR to the even-bit line GBLe; a transistor YBLo, adapted to connect the virtual power supply VIRPWR to the odd-bit line GBLo. A NAND string is connected between the even-bit line GBLe and the source line SL, and a NAND string is connected between the odd-bit line GBLo and the source line SL. For example, in the readout action, a mask readout is performed. When the even-bit line GBLe is selected, the odd-bit line GBLo is not selected. And when the odd-bit line GBLo is selected, the even-bit line GBLe is not selected. The unselected bit line is connected to the ground (GND) level through the virtual power supply VIRPWR.

Figure 7:
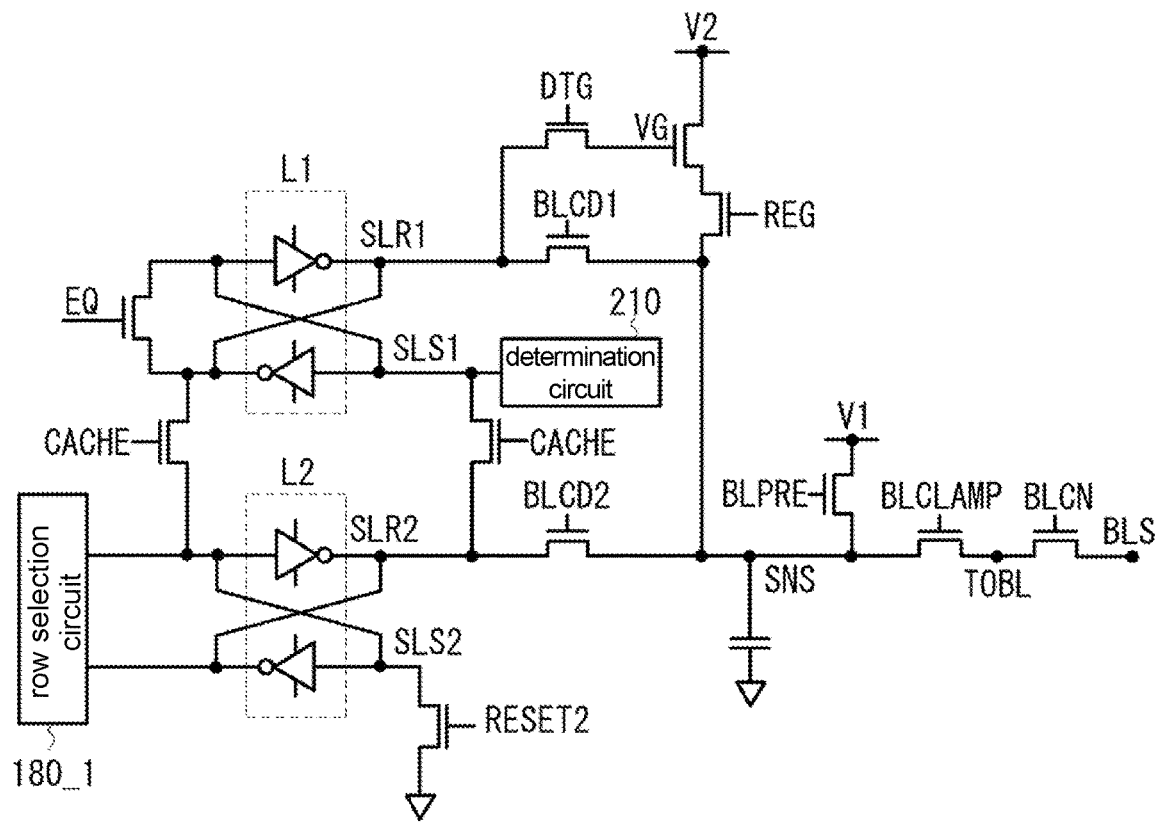
FIG. 7 is a diagram of a structure of a page buffer/readout circuit according to an embodiment.

FIG. 7 shows the structure of the page buffer/readout circuit 170_1 in FIG. 6. For the sake of convenience, it is assumed that the signal applied to the gate of the transistor represents the transistor. The page buffer/readout circuit 170 includes the latches L1 and L2, and a transfer gate (a transistor CACHE) is connected between the latch L1 and the latch L2. By connecting the transfer gate, it is possible to transfer data bidirectionally from the latch L1 to the latch L2 or from the latch L2 to the latch L1.

The latch L1 includes a pair of cross-coupled inverters. A node SLR1 of the latch L1 is connected to the common source/drain (S/D) of a transistor BLCD1 and a transistor DTG. The node SLS1 is connected to a determination circuit 210. The determination circuit 210 determines, for example, whether program verification or erasure verification is qualified. In the program verification, when a voltage supply node V2 selectively charges the node SLR1 to Vdd, or selectively discharges the node SLR1 to the GND, the transistor DTG is turned on. As such, the latch L1 may short-circuit the node SLR1 and the node SLS1 through a transistor EQ.

The node SLR1 and the node SLS1 of the latch L1 are respectively connected to a node SLS2 and a node SLR2 of the latch L2 through the transistor CACHE. The node SLR2 of the latch L2 is connected to the readout node SNS through a transistor BLCD2, and the node SLS2 is connected to a transistor RESET2. When the latch L2 is to be reset, the transistor RESET2 is turned on.

A transistor VG and a transistor REG are connected in series between the voltage supply node V2 and the readout node SNS, and the gate of the transistor VG is connected to the source/drain S/D of the transistor DTG. The voltage supply node V1 is connected to the readout node SNS through a transistor BLPRE. A transistor BLCN and a transistor BLCLAMP are connected in series between the readout node SNS and a node BLS of the bit-line selection circuit 200.

The word-line selection circuit 160_1 and the row selection circuit 180_1 select the readout start position of the data in the page according to the column address information Ax and the row address information Ay, or read data automatically from the beginning of the page without using the column address information Ax and the row address information Ay. As such, the word-line selection circuit 160_1 and the row selection circuit 180_1 may include a column address counter and a row address counter that increment the column address information Ax and the row address information Ay in response to a clock signal.

When the data held in the latch L2 of the page buffer/readout circuit 170_1 is output, the row selection circuit 180_1 selects n-bit data from the data held in the latch L2. The selected n-bit data is registered to "n" number of differential readout amplifiers as the differential data of the node SLS2 and the node SLR2, and "n" number of the differential readout amplifiers output the read n-bit data to an internal data bus with an n-bit width.

The data output from the internal data bus with an n-bit width is selectively supplied to the ECC circuit 130 or the input/output circuit 120 through the transmission circuit. The ECC circuit 130 performs error checking and correction on the data supplied through the internal data bus. The input/output circuit 120 includes, for example, a parallel/series conversion circuit directly connected to a plurality of flip-flops. The parallel/series conversion circuit converts the data input in parallel from the internal data bus into series in synchronization with the external clock signal ExCLK, and supplies the converted data to the external terminal. The external terminal may be, for example, ×1, ×2, ×4, and ×8.

In the readout action of the flash memory, a certain positive voltage is applied to the bit line, a certain voltage (for example, 0V) is applied to the selected word line, a pass voltage Vpass (for example, 4.5V) is applied to the unselected word line, and a positive voltage (for example, 4.5V) is applied to the select gate line SGD and the select gate line SGS, which turns on the bit-line side selection transistor and the source-line side selection transistor, and 0V is applied to the common source line. In the programming action, a high-voltage programming voltage Vpgm (15V~20V) is applied to the selected word line, an intermediate potential (for example, 10V) is applied to the unselected word line, which turns on the bit-line side selection transistor, turns off the source-line side selection transistor, and supplies the potential corresponding to the data "0" or "1" to the bit line. In the erasure action, 0V is applied to the selected word line in the block, a high voltage (for example, 20V) is applied to the P-well, and the electrons from the floating gate are drawn to the substrate to erase data in the unit of blocks.

In the normal readout action, programming action, and erasure action of the flash memory 100, the controller 150 controls the action of the memory cell arrays 110_1 and 110_2 like one memory cell array. When the flash memory 100 receives normal readout of page command and address from the host computer, the command is determined by the controller 150. Under the control of the controller 150, the word-line selection circuit 160_1 and the word-line selection circuit 160_2 simultaneously select the word lines in the same column of the memory cell array 110_1 and the memory cell array 110_2 based on the column address information Ax. In other words, the selection of the word line of the memory cell array 110_1 corresponds to the readout of the data of the half page, and the selection of the word line of the memory cell array 110_2 corresponds to the readout of the data of the half page. As a result, the selection of the word line using the word-line selection circuit 160_1 and the word-line selection circuit 160_2 corresponds to the readout of one page of data.

In the readout action, first, the selected bit line (for example, an even-bit line) is precharged by the voltage supply node V1 of the page buffer/readout circuit 170_1 and the page buffer/readout circuit 170_2 through the transistor BLPRE. Next, the word lines of the memory cell array 110_1 and the memory cell array 110_2 are selected, and the voltage of the selected bit line is discharged according to the storage state of the selected memory cell. Next, the potential generated in the readout node SNS is transferred to the latch L1, and thus the array readout is completed.

Next, the continuous readout action of the flash memory is described. In the continuous readout action, unlike the normal readout of page, the controller 150 separately controls the timing of the array readout of the memory cell array 110_1 and the memory cell array 110_2.

When receiving a continuous read command and an address through the input/output circuit 120, the controller 150 determines the command and controls the continuous readout of multiple pages from the start page to the end page. The continuous readout is ended by a command or when the specified page is read.

Figure 1:
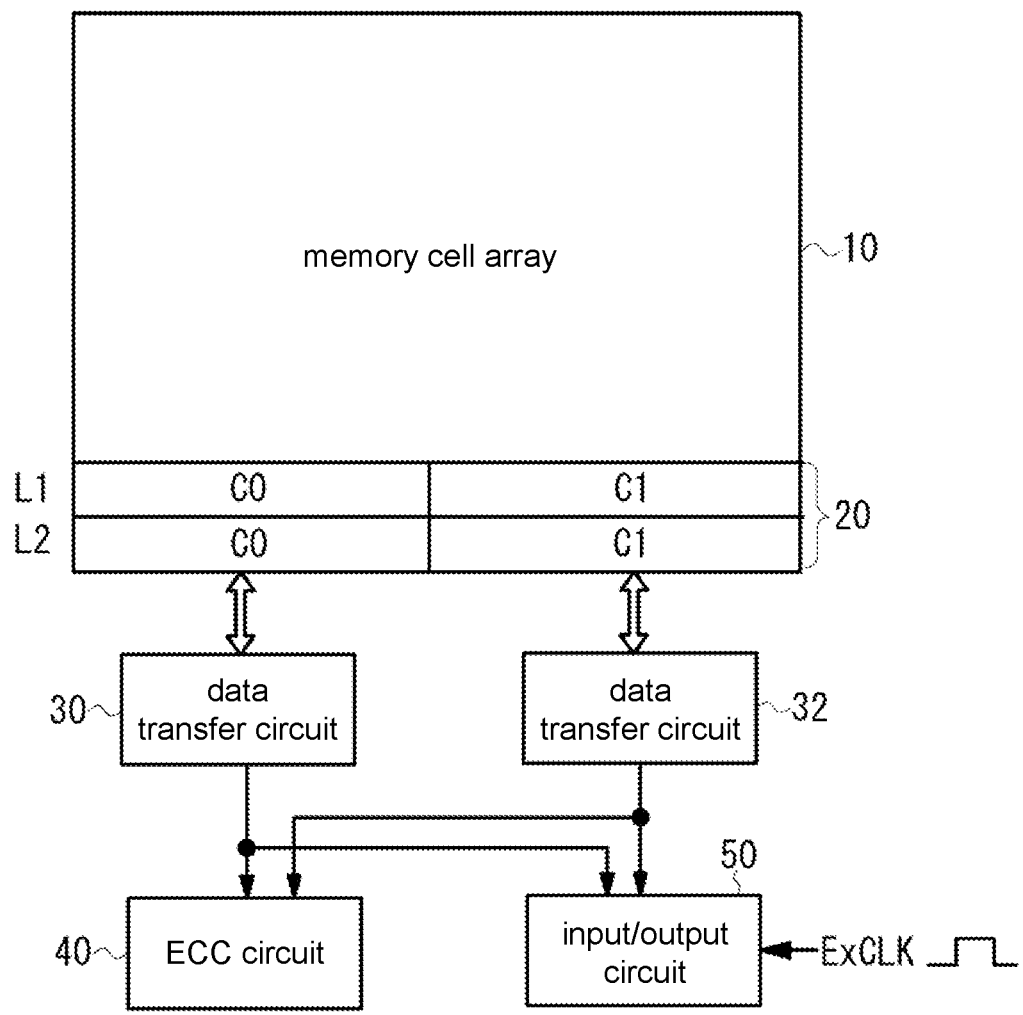
FIG. 1 is a schematic diagram of a structure of a conventional NAND flash memory.
Figure 2:
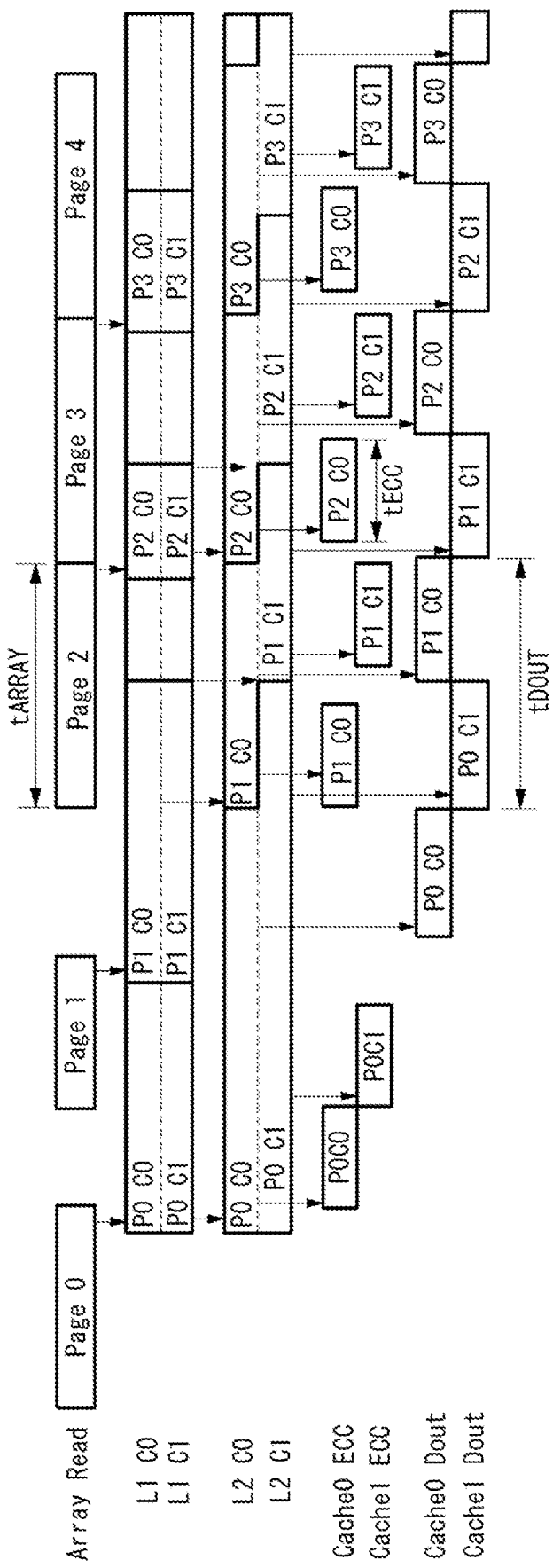
FIG. 2 is a timing chart of continuous readout in a conventional NAND flash memory.
Figure 8:
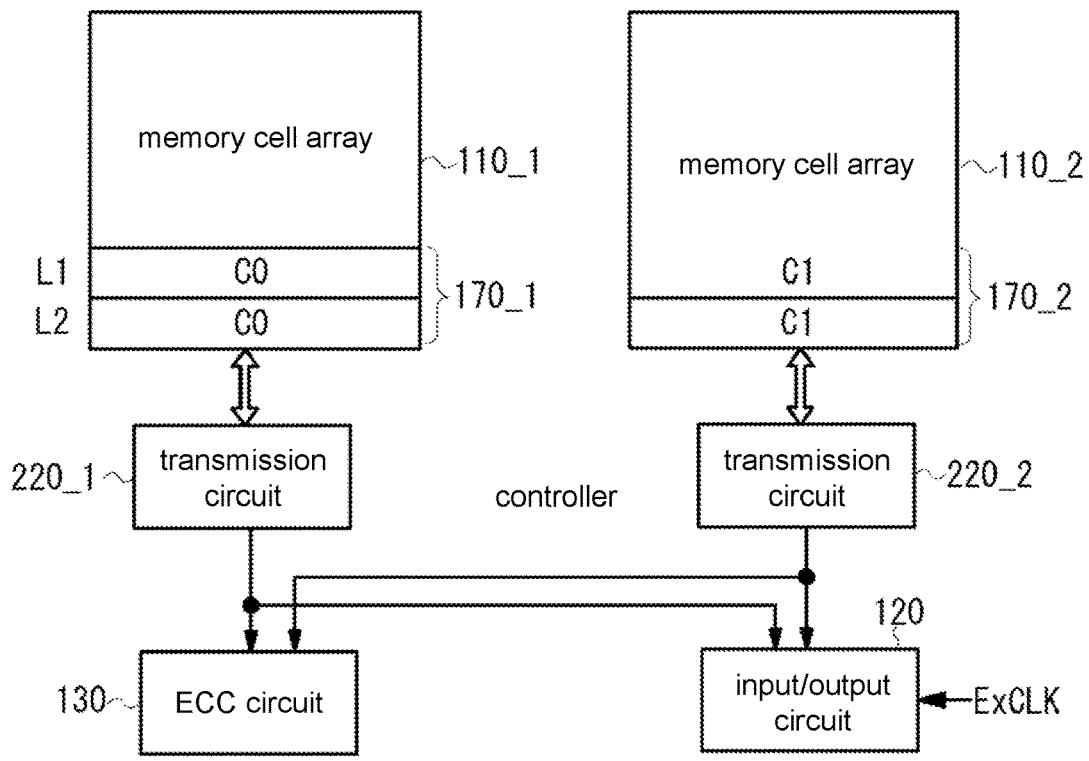
FIG. 8 is a diagram schematically illustrating a continuous readout action according to an embodiment.

FIG. 8 is a schematic diagram for explaining the continuous readout action of the present embodiment. As shown in FIG. 1, one page of data is read from the memory cell array at a time, and the read data is simultaneously sent to the first cache C0 and the second cache C1 of the latch L1. However, in the continuous readout of the flash memory 100, the data of the half page is read from the memory cell array 110_1 and the memory cell array 110_2 at different timings, and the read data is sent to the first cache C0 and the second cache C1 of the latch L1 at different timings.

Specifically speaking, the data of the first half page of a certain page is read from the memory cell array 110_1, and the read data is transferred to the first cache C0 of the latch L1 and held therein. After the memory cell array 110_1 is read, the last half page of the certain page is read from the memory cell array 110_2. The read data is transferred to the second cache C1 of the latch L1 and held therein.

Then, the data held in the first cache C0 and the second cache C1 of the latch L1 are transferred to the first cache C0 and the second cache C1 of the latch L2 to be held therein. The data held in the first cache C0 of the latch L2 is transferred to the ECC circuit 130 through the transmission circuit 220_1. Here, the error checking and correction is performed on the data, and then the data is transferred to the input/output circuit 120 through the transmission circuit 220_1, at which it is output in synchronization with the external clock signal ExCLK. During the processing performed by the ECC circuit 130, the data of the first half page of the next page is read, and the data is held in the first cache C0 of the latch L1.

In response to the data of the latch L2 being sent to the input-output circuit 120, the data of the first cache C0 of the latch L1 being sent to the first cache C0 of the latch L2, and the data of the first half page of the next page (the first two pages of the output page) being read from the memory cell array 110_1, the data is transferred to the first cache C0 of the latch L1.

The readout of the memory cell array 110_2 is performed in the same manner as the readout of the memory cell array 110_1. The controller 150 controls the timing of the array readout of the memory cell array 110_2, so that, after the data of the first cache C0 of the latch L2 is output in synchronization with the external clock signal ExCLK, the data of the second cache C1 of the latch L2 is output in synchronization with the external clock signal ExCLK.

Figure 9:
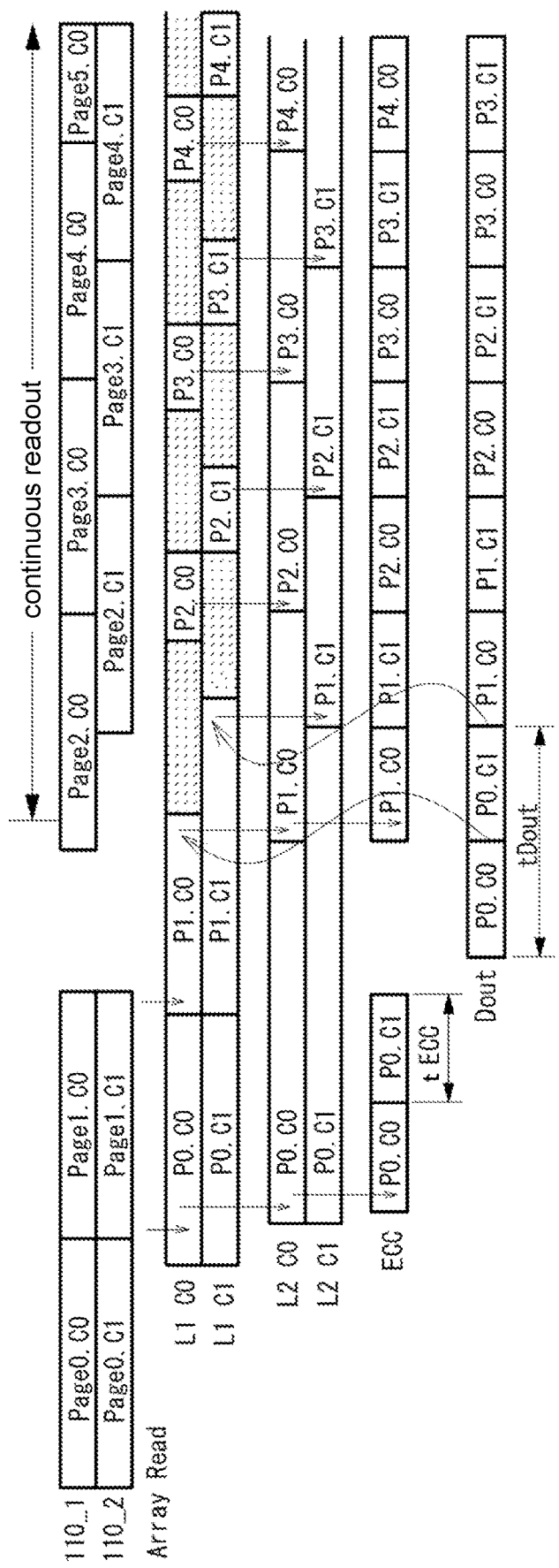
FIG. 9 is a timing chart when a continuous readout action is performed in the flash memory according to an embodiment.

FIG. 9 is a specific timing chart of the continuous readout action based on the present embodiment. The area filled by the dotted line in the figure represents the release state of the latch L1 and the latch L2. In other words, even if it is overwritten, the data will not be destroyed.

The readout of the page P0 and the page P1 is the same as the normal readout of page, and the page P0 and the page P1 are read from the memory cell array 110_1 and the memory cell array 110_2 at the same timing. The continuous readout starts from page P2. In response to the end of the output of the data of the page P0 held in the first cache C0 of the latch L2 (the input/output circuit 120), the data of the page P1 in the first cache C0 of the latch L1 is transferred to the first cache C0 of the latch L2, and the data of the first half page of the page P2 read from the memory cell array 110_1 is transferred to the first cache C0 of the latch L1 and held therein. Compared to the time required for the array readout, the data transfer time from the latch L1 to the latch L2 is very short. Therefore, at the point in time when the data read from the array is transferred to the latch L1, the latch L1 is released.

Then, during the output of the data of the page P0 held in the second cache C1 of the latch L2, the data of the page P1 held in the first cache C0 of the latch L2 is subjected to the ECC processing. In response to the end of the output of the data of the page P0 held in the second cache C1 of the latch L2, the data of the page P1 of the second cache C1 of the latch L1 is transferred to the second cache C1 of the latch L2, and the data of the last half page of the page P2 read from the memory cell array 110_2 is transferred to the second cache C1 of the latch L1 and held therein. After that, the continuous readout of pages is performed in the same manner.

Equation (4) as a condition for the continuous readout needs to be satisfied:

$$tECC(\text{half page}) < tDout(\text{half page}) \qquad \text{Equation (4)},$$

wherein tDout is determined by the frequency of the external clock signal ExCLK. In order to reduce the time tECC, the ECC circuit 130 may further include multiple ECC circuits. The data error checking and correction are performed in parallel through the ECC circuits.

In this way, in the continuous readout of the present embodiment, by reading the data of the half page from the memory cell array 110_1 and the memory cell array 110_2 at different timings, after the data of the first cache C0 of the latch L2 is output, the data of the half page output read from the memory cell array 110_1 is transferred to the first cache C0 of the latch L1; and after the data of the second cache C1 of the latch L2 is output, the data of the half page read from the memory cell array 110_2 is transferred to the second cache C1 of the latch L1, thereby preventing the data held in the latch L1 from being destroyed by the data read from the memory cell array due to the slower frequency of the external clock signal ExCLK in the conventional continuous readout action, which makes the continuously read pages not restricted by the frequency of the external clock signal ExCLK. In addition, there is no need to prepare a status register for the user to switch the timing of the array reading as in the past.

Furthermore, in the continuous readout of the present embodiment, the peak current during the array readout may be reduced. In other words, in the existing array readout, the bit lines of one page are precharged, which generates a large peak current. The memory cell array 110_1 and the memory cell array 110_2 precharge the bit lines of the half page at separate timings to reduce the peak current. As a result, the supply voltage inside the chip may be stabilized, and the reliability of circuit actions may be improved.

Figure 10A:
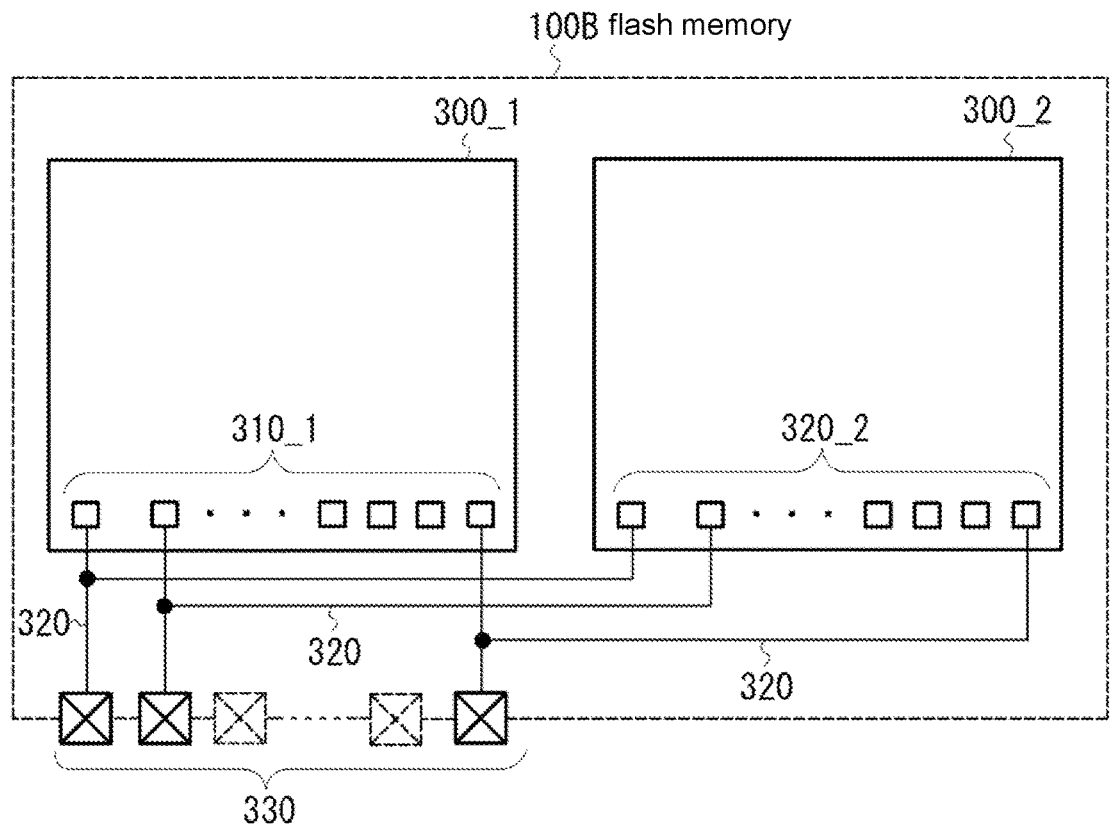
FIG. 10A is a diagram of the structure of a flash memory according to a modified example of an embodiment of the present disclosure.

Next, a modified example of the embodiment of the present disclosure is described. In the previous embodiment, the two arrays are formed on the same chip in a way that the actions of the memory cell array 110_1 and the memory cell array 110_2 are functionally separated. However, in this modified example as shown in FIG. 10A, a flash memory 100B includes two chips, a chip 300_1 and a chip 300_2 in a way that two memory cell arrays are separated physically. The chips 300_1 and 300_2 may be stacked, or arranged in parallel. A plurality of internal bonding pads 310_1 for input and output formed on the chip 300_1 are electrically connected to the corresponding external terminals 330 for input and output through internal wirings 320. Similarly, a plurality of internal bonding pads 320_2 for input and output formed on the chip 300_2 are electrically connected to the corresponding external terminals 330 for input and output through internal wirings 320.

Figure 10B:
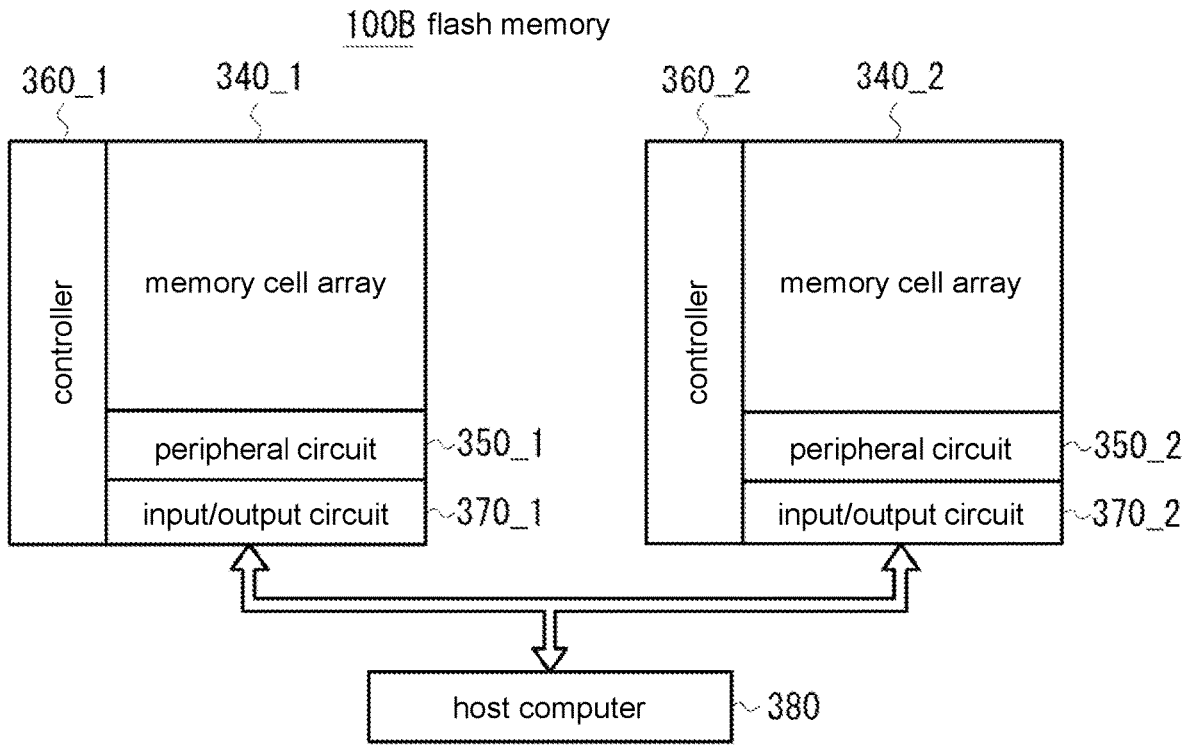
FIG. 10B is a diagram of the internal structure thereof.

FIG. 10B is a block diagram of the internal structure of each chip. The chip 300_1 includes: a memory cell array 340_1, comprising a plurality of NAND strings; a peripheral circuit 350_1, formed with a word-line selection circuit or a page buffer/readout circuit, etc.; a controller 360_1, adapted to control actions of the chip 300_1; and an input/output circuit 370_1, connected to the internal bonding pad 310_1. The other chip 300_2 has the same structure as the chip 300_1.

The chip 300_1 and the chip 300_2 are connected to a host computer 380 through an external terminal 330. Commands (for reading, programming, erasing, etc.) and addresses that are output from the host computer 380 are input to the chip 300_1 and the chip 300_2 through the external terminal 330 in a common manner. When inputting continuously read commands and addresses from the host computer 380, the controller 360_1 and the controller 360_2 perform continuous readout control in each of the chips 300_1 and the chip 300_2 as in the timing chart shown in FIG. 9. The controller 360_1 reads the first half page and outputs the read data from the external terminal 330 through the input/output circuit 370_1. The controller 360_2 reads the next half page, and outputs the read data from the external terminal 330 through the input/output circuit 370_2. In this way, the continuously read data of multiple pages is output from the external terminal 330.

The embodiments of the present disclosure have been described in detail, but the present disclosure is not limited to specific embodiments, as various modifications and changes may be made within the scope of the subject of the present disclosure described in the claims.

What is claimed is:

1. A continuous readout method of pages of a NAND flash memory, the continuous readout method comprising:
   a first readout step, reading a first data of a half page from a first memory cell array, and holding the readout of the first data in a first holding circuit;
   a second readout step, reading a second data of a half page from a second memory cell array at a different timing from the first memory cell array, and holding the readout of the second data in a second holding circuit;
   a first output step, outputting the first data in synchronization with a clock signal; and a second output step, outputting the second data continuously after outputting the first data in synchronization with the clock signal.

2. The continuous readout method according to claim 1, further comprising:
a first transfer step, transferring the first data held in the first holding circuit to a third holding circuit; and
a second transfer step, transferring the second data held in the second holding circuit to a fourth holding circuit,
wherein, after the first transfer step, a first data of a half page of a next page read in the first readout step is held in the first holding circuit, and
after the second transfer step, a second data of a half page of the next page read in the second readout step is held in the second holding circuit.

3. The continuous readout method according to claim 2, further comprising:
a first error checking and correction step, performing error checking and correction on the first data held in the third holding circuit; and
a second error checking and correction step, performing error checking and correction on the second data held in the fourth holding circuit.

4. The continuous readout method according to claim 3, wherein:
while the first data held in the third holding circuit is output in the first output step, the second error checking and correction step performs error checking and correction on the second data of the next page held in the fourth holding circuit; and
while the second data held in the fourth holding circuit is output in the second output step, the first error checking and correction step performs error checking and correction on the first data of the next page held in the third holding circuit.

5. The continuous readout method according to claim 2, wherein:
in the first readout step, in response to the output of the first data held in the third holding circuit through the first output step, performing readout of the first data of the half page of the first two pages, in the second readout step, in response to the output of the second data held in the fourth holding circuit through the second output step, performing readout of the second data of the half page of the second two pages.

6. The continuous readout method according to claim 5, wherein:
the first output step and the second output step alternately and continuously output the first data and the second data from each of a plurality of external terminals.

7. The continuous readout method according to claim 1, comprising:
wherein, the first and the second readout step, performing an array readout of a first half page and an array readout of a last half page respectively and independently on the first and the second memory cell array;
a holding step, holding the first data of the half page read from the first array in the first holding circuit, and holding the second data of the half page read from the second array in the second holding circuit; and
wherein, the first and the second output step, performing the first and the second readout steps and the first and the second holding steps by reading a plurality of pages, and outputting the first data and the second data alternately in synchronization with a clock signal.

8. A semiconductor apparatus, comprising:
a first array readout component, adapted to read data from a NAND first memory cell array;
a second array readout component, adapted to read data from a NAND second memory cell array;
a first holding component, adapted to hold the data read by the first array readout component;
a second holding component, adapted to hold the data read by the second array readout component;
an output component, adapted to output the data held by the first holding component and the second holding component in synchronization with a clock signal; and
a control component, adapted to control a readout action,
wherein, providing that the control component controls continuous readout of pages, the first array readout component reads a first data of a half page, the second array readout component reads a second data of a half page, and the output component outputs the first data and the second data alternately and continuously,
wherein the first holding component comprises: a first latch, adapted to hold the first data read by the first array readout component; and a second latch, adapted to hold the first data transferred from the first latch, wherein after the first data is transferred from the first latch to the second latch, a first data of a half page of a next page read by the first array readout component is held in the first latch; and
the second holding component comprises: a first latch, adapted to hold the second data read by the second array readout component; and a second latch, adapted to hold the second data transferred from the first latch, wherein after the second data is transferred from the first latch to the second latch, a second data of a half page of a next page read by the second array readout component is held in the first latch.

9. The semiconductor apparatus according to claim 8, further comprising:
an error checking and correction component, adapted to perform error checking and correction on data, wherein the error checking and correction component performs error checking and correction on the first data or the second data held in the second latch of the first holding component and the second holding component.

10. The semiconductor apparatus according to claim 9, wherein:
while the output component outputs the first data held in the second latch of the first holding component, the error checking and correction component performs error checking and correction on the second data of the next page held in the second latch of the second holding component; and
while the output component outputs the second data held in the second latch of the second holding component, the error checking and correction component performs error checking and correction on the first data of the next page held in the second latch of the first holding component.

11. The semiconductor apparatus according to claim 8, wherein:
the first array readout component responds to the output component outputting the first data held in the second latch of the first holding component, performing the readout of the first data of the half page of first two pages; and the second array readout component responds to the output component outputting the second data held in the second latch of the second holding component, performing the readout of the second data of the half page of the first two pages.

12. The semiconductor apparatus according to claim 8, wherein the first memory cell array and the second memory cell array are formed on a same chip.

13. The semiconductor apparatus according to claim 8, wherein the semiconductor apparatus comprises at least two chips, and the first memory cell array and the second memory cell array are formed on different chips.

14. The semiconductor apparatus according to claim 8, wherein the output component alternately and continuously outputs the first data and the second data from each of a plurality of external terminals.

15. A readout method of a NAND flash memory, the readout method comprising:

receiving a command;

based on the command, determining whether a readout action is normal readout of page or continuous readout of a plurality of pages;

when the readout action is determined to be normal readout of page, accessing a first memory cell array and a second memory cell array at the same time, reading one page of data from the first memory cell array and the second memory cell array, and holding the readout of one page of data in a first holding circuit and a second holding circuit; and when the readout action is determined to be continuous readout of the plurality of pages, accessing the first memory cell array and the second memory cell array respectively, reading a first data of a half page from the first memory cell array, holding the readout of the first data in the first holding circuit, reading a second data of rest of the half page from the second memory cell array, and holding the readout of the second data in the second holding circuit.

* * * * *